United States Patent
Tak et al.

(10) Patent No.: US 10,229,831 B2
(45) Date of Patent: Mar. 12, 2019

(54) METHOD OF FORMING NITRIDE SEMICONDUCTOR SUBSTRATE AND METHOD OF FABRICATING SEMICONDUCTOR DEVICE

(71) Applicant: Samsung Electronics Co., Ltd., Suwon-si, Gyeonggi-do (KR)

(72) Inventors: Youngjo Tak, Seongnam-si (KR); Sammook Kang, Hwaseong-si (KR); Mihyun Kim, Seoul (KR); Junyoun Kim, Hwaseong-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 15/656,305

(22) Filed: Jul. 21, 2017

(65) Prior Publication Data

US 2018/0174822 A1 Jun. 21, 2018

(30) Foreign Application Priority Data

Dec. 16, 2016 (KR) ........................ 10-2016-0172827

(51) Int. Cl.
*H01L 21/02* (2006.01)

(52) U.S. Cl.
CPC ...... *H01L 21/0254* (2013.01); *H01L 21/0262* (2013.01); *H01L 21/02381* (2013.01); *H01L 21/02458* (2013.01); *H01L 21/02507* (2013.01); *H01L 21/02639* (2013.01); *H01L 21/02664* (2013.01)

(58) Field of Classification Search
None
See application file for complete search history.

(56) References Cited

U.S. PATENT DOCUMENTS

| | | | |
|---|---|---|---|
| 7,723,217 B2 | 5/2010 | Lee et al. |
| 8,030,665 B2 | 10/2011 | Nagahama et al. |
| 8,334,192 B2 | 12/2012 | Lee |
| 8,541,314 B2 | 9/2013 | Lee et al. |
| 8,946,773 B2 | 2/2015 | Tak et al. |
| 8,969,178 B2 | 3/2015 | Lee et al. |
| 9,337,381 B2 | 5/2016 | Kim et al. |
| 9,337,881 B2 | 5/2016 | Aihsan et al. |

(Continued)

FOREIGN PATENT DOCUMENTS

| | | |
|---|---|---|
| KR | 101178399 B1 | 8/2012 |
| KR | 2013-0081956 A | 7/2013 |
| KR | 2014-0036412 A | 3/2014 |

*Primary Examiner* — Bradley Smith
(74) *Attorney, Agent, or Firm* — Harness, Dickey & Pierce, P.L.C.

(57) ABSTRACT

A method of fabricating a nitride semiconductor substrate including forming a buffer layer on a surface of a growth substrate, growing a first nitride semiconductor layer on the buffer layer, growing a second nitride semiconductor layer on the first nitride semiconductor layer, and removing the growth substrate may be provided. The forming a buffer layer may deform the surface of the growth substrate to have a convex shape. The forming a buffer layer and the growing a first nitride semiconductor layer may be performed within a first process chamber. The growing a second nitride semiconductor layer and the removing the growth substrate may be performed within a second process chamber.

19 Claims, 6 Drawing Sheets

(56) References Cited

U.S. PATENT DOCUMENTS

| | | | |
|---|---|---|---|
| 2003/0033973 A1* | 2/2003 | Hayashida | C01C 1/003 117/84 |
| 2005/0284572 A1* | 12/2005 | Chen | H01J 37/32871 156/345.31 |
| 2012/0304930 A1* | 12/2012 | Verdict et al. | C30B 25/14 |
| 2015/0050471 A1* | 2/2015 | Lipski et al. | C30B 25/04 |
| 2015/0340555 A1 | 11/2015 | Yang et al. | |
| 2017/0084456 A1* | 3/2017 | Olsen et al. | H01L 21/02658 |
| 2018/0138220 A1* | 5/2018 | Wu et al. | H01L 27/14616 |

* cited by examiner

METHOD OF FORMING NITRIDE SEMICONDUCTOR SUBSTRATE AND METHOD OF FABRICATING SEMICONDUCTOR DEVICE

CROSS-REFERENCE TO RELATED APPLICATIONS

This U.S. non-provisional patent application claims priority under 35 U.S.C. § 119 to Korean Patent Application No. 10-2016-0172827, filed on Dec. 16, 2016, in the Korean Intellectual Property Office, the entire contents of which are hereby incorporated by reference.

BACKGROUND

1. Field

Some example embodiments of the present disclosure relate to methods of forming a nitride semiconductor substrate and/or methods of fabricating a semiconductor device, and in particular, to methods of controlling stress, which occurs when a nitride semiconductor substrate is formed.

2. Description of the Related Art

A sapphire substrate is widely used as a substrate for forming nitride-based semiconductor devices. However, because the sapphire substrate is expensive and hard, there are challenges in using the sapphire substrate for semiconductor chips. Further, the sapphire substrate has low electric conductivity and low thermal conductivity. In the case where a large-sized sapphire substrate is formed by an epitaxial growth process, the low thermal conductivity of the sapphire substrate may result in a warpage issue under a high temperature environment of the epitaxial growth process. Thus, it is difficult to fabricate a large-sized sapphire substrate. To overcome these limitations of the sapphire substrate, a nitride-based semiconductor device utilizing a heterogeneous semiconductor substrate is being studied. For example, a silicon substrate has thermal conductivity higher than that of a sapphire substrate. Thus, compared with the sapphire substrate, the extent of warpage of the silicon substrate may not be large at a high temperature for growing a nitride film. Thus, the silicon substrate can be used to grow a large-sized thin-film.

However, in the case where a nitride film is grown on a silicon substrate to collectively form a heterogeneous semiconductor substrate, mismatch in lattice constant between the substrate and the nitride film may lead to an increase in dislocation density. Furthermore, due to a difference in thermal expansion coefficient between the silicon substrate and the nitride film, a tensile stress that may cause a crack in the nitride film may be produced. Thus, many studies are being conducted to develop methods of growing a crack-free nitride film with a high degree of crystallinity on a silicon substrate to collectively form a heterogeneous semiconductor substrate.

SUMMARY

Some example embodiments of the inventive concepts provide methods of controlling stress, which occurs when a nitride semiconductor substrate is formed.

According to some example embodiments of the inventive concepts, a method of fabricating a nitride semiconductor substrate includes forming a buffer layer on a surface of a growth substrate within a first process chamber, the buffer layer deforming the surface of the growth substrate to have a convex shape, growing a first nitride semiconductor layer on the buffer layer within the first process chamber, growing a second nitride semiconductor layer on the first nitride semiconductor layer within a second process chamber, and removing the growth substrate within the second process chamber.

According to some example embodiments of the inventive concepts, a method of fabricating a semiconductor device includes forming a buffer layer on a growth substrate, forming a first nitride semiconductor layer on the buffer layer, forming a second nitride semiconductor layer on the first nitride semiconductor layer, and removing the growth substrate. The forming a buffer layer and the forming a first nitride semiconductor layer may be performed within a first process chamber, and the forming a second nitride semiconductor layer and the removing the growth substrate may be performed within a second process chamber. The buffer layer may be formed to exert a first deformation force on an edge portion of the growth substrate, in a first direction parallel to a center axis of the growth substrate, and the first and second nitride semiconductor layers may be formed to exert a second deformation force on the edge portion of the growth substrate, in a second direction opposite to the first direction. The first and second deformation forces may have substantially the same magnitude.

According to some example embodiments of the inventive concepts, a method of fabricating a nitride semiconductor substrate includes forming a buffer layer on a surface of a growth substrate in a first process chamber, the forming a buffer layer deforming the surface of the growth substrate to have a convex shape, growing a first nitride semiconductor layer on the buffer layer in the first process chamber, the first nitride semiconductor layer having a lattice constant greater than that of the growth substrate, growing a second nitride semiconductor layer on the first nitride semiconductor layer in a second process chamber, the second nitride semiconductor layer having a lattice constant greater than that of the growth substrate, and removing the growth substrate within the second process chamber.

BRIEF DESCRIPTION OF THE DRAWINGS

Example embodiments will be more clearly understood from the following brief description taken in conjunction with the accompanying drawings. The accompanying drawings represent non-limiting, example embodiments as described herein.

It should be noted that these figures are intended to illustrate some characteristics of methods, structure and/or materials utilized in certain example embodiments and to supplement the written description provided below. These drawings are not, however, to scale and may not precisely reflect the precise structural or performance characteristics of any given example embodiment, and should not be interpreted as defining or limiting the range of values or properties encompassed by example embodiments. For example, the relative thicknesses and positioning of molecules, layers, regions and/or structural elements may be reduced or exaggerated for clarity. The use of similar or identical reference numbers in the various drawings is intended to indicate the presence of a similar or identical element or feature.

DETAILED DESCRIPTION

Example embodiments of the inventive concepts will now be described more fully with reference to the accompanying drawings, in which some example embodiments are shown.

Figure 1:
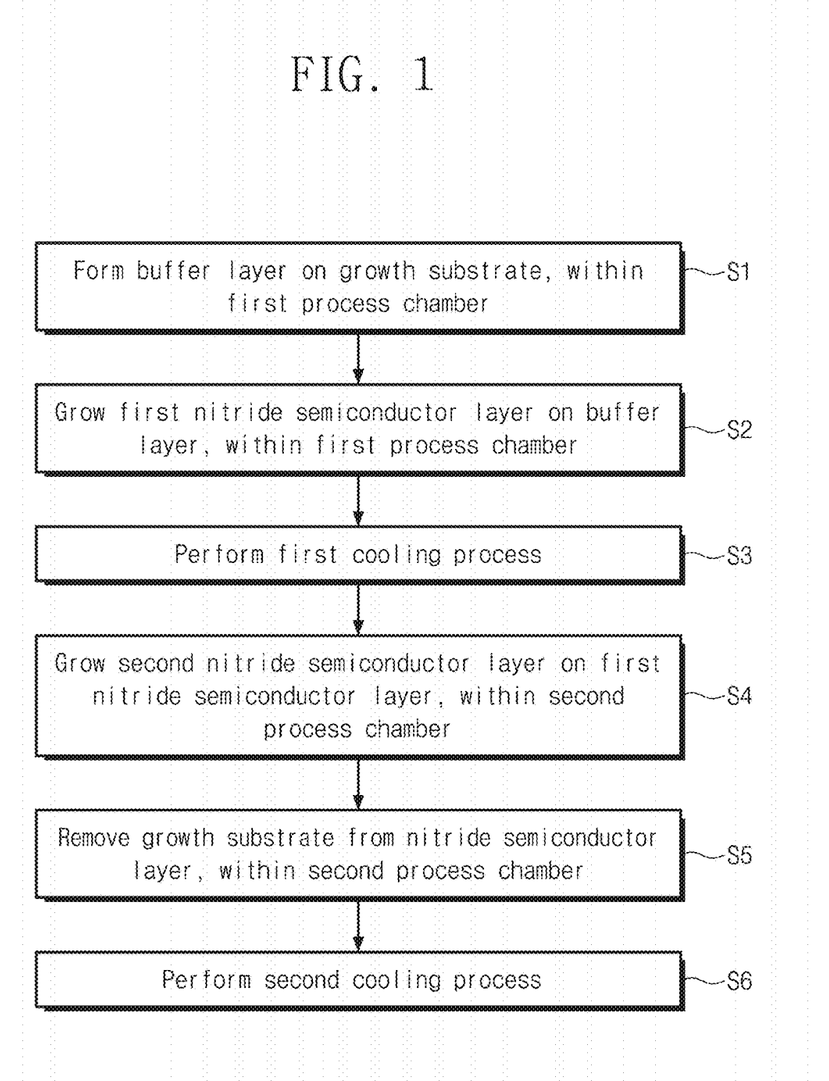
FIG. 1 is a process flow chart illustrating a method of fabricating a nitride semiconductor substrate, according to some example embodiments of the inventive concepts.
Figure 7A:
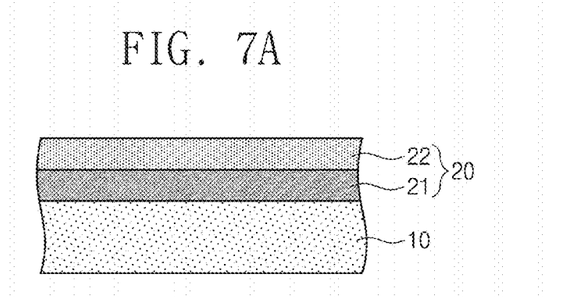
FIGS. 7A and 7B are sectional views illustrating a buffer layer.
Figure 7B:
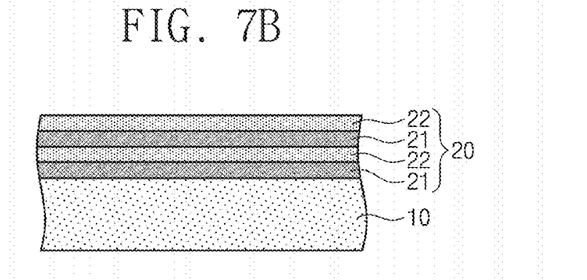
Figure 8:
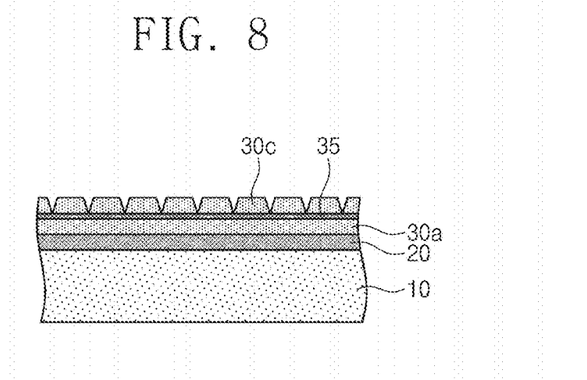
FIG. 8 is a sectional view illustrating a surface treatment process on a nitride semiconductor layer.
Figure 9:
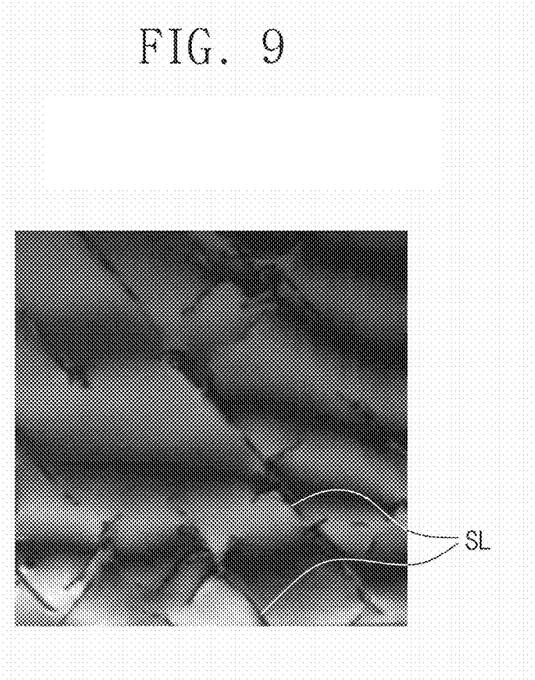
FIG. 9 is a transmission electron microscopy (TEM) _image showing plastic deformation, which occurred on a top surface of a growth substrate.

FIG. 1 is a process flow chart illustrating a method of fabricating a nitride semiconductor substrate, according to some example embodiments of the inventive concepts. FIGS. 2 to 6 are sectional views illustrating a method of fabricating a nitride semiconductor substrate, according to some example embodiments of the inventive concepts. FIGS. 7A and 7B are sectional views illustrating a buffer layer. FIG. 8 is a sectional view illustrating a surface treatment process on a nitride semiconductor layer. FIG. 9 is a TEM image showing plastic deformation, which occurred on a top surface of a growth substrate.

Figure 2:
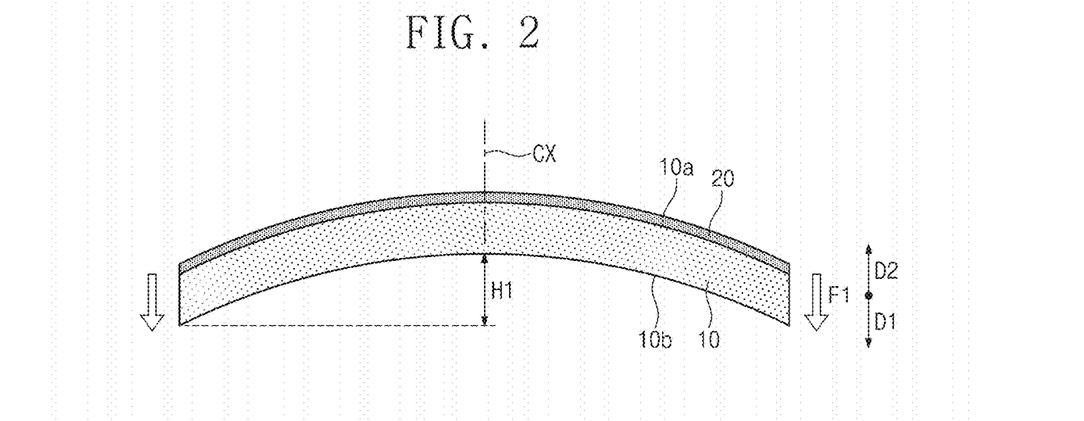
FIGS. 2 to 6 are sectional views illustrating a method of fabricating a nitride semiconductor substrate, according to some example embodiments of the inventive concepts.

Referring to FIGS. 1 and 2, within a first process chamber, a buffer layer 20 may be formed on a growth substrate 10 (S1). The growth substrate 10 may be formed of a semiconductor material that is different from that of a nitride semiconductor layer to be described below. The growth substrate 10 may be formed of a material whose lattice constant is less than that of the nitride semiconductor layer, but the inventive concepts are not limited thereto. As an example, the growth substrate 10 may be one of a silicon substrate, a SiC substrate, or a GaAs substrate. For the sake of simplicity, the description that follows will refer to an example in which the growth substrate 10 is a silicon wafer, but the inventive concepts are not limited thereto. The growth substrate 10 may have a first surface 10a and a second surface 10b that are flat.

The buffer layer 20 may be formed by a method different from a growth method of a nitride semiconductor layer to be described below. As an example, the buffer layer 20 may be formed by one of metal organic chemical vapor deposition (MOCVD), molecular beam epitaxy (MBE), or metal organic vapor phase epitaxy (MOVPE) methods, and the first process chamber may be configured to perform such a process. In some example embodiments, the formation of the buffer layer 20 may be performed at a temperature of about 100° C. to 1200° C.

The buffer layer 20 may exert stress on the growth substrate 10 thereunder. For example, a compressive stress may be exerted on the buffer layer 20, and a tensile stress may be exerted on an upper portion of the growth substrate 10 adjacent thereto. The buffer layer 20 may deform the growth substrate 10 in such a way that the first surface 10a has a positive curvature. As a result, a first deformation force F1 may be exerted on an edge portion of the growth substrate 10, which is farthest away from a center axis CX of the growth substrate 10, in a downward direction (hereinafter, first direction D1) (e.g., in a direction from the first surface 10a, which is covered with the buffer layer 20, toward the second surface 10b). Accordingly, the growth substrate 10 covered with the buffer layer 20 may be deformed in the first direction D1 such that there is a difference in heights between the edge portion and a center portion of the growth substrate 10. A magnitude of a force causing the deformation of the growth substrate 10 may be proportional to a height difference H1 between the edge portion and the center portion of the growth substrate 10 (e.g., a vertical distance between an uppermost point and a lowermost point of the growth substrate 10 of the convex and bottom of the convex along the center axis CX of the growth substrate 10).

In the present specification, when the growth substrate 10 is deformed in such a way that its center portion is located above its edge portion in a second direction D2, the growth substrate 10 will be described to have a convex shape. For example, when the growth substrate 10 has the convex shape, its center portion may protrude toward the first surface 10a or the buffer layer 20 (e.g., in the second direction D2 as illustrated in FIG. 2).

FIGS. 7A and 7B are sectional views illustrating two examples of the buffer layer 20. The buffer layer 20 may be a nitride layer made of $B_xAl_yIn_zGa_{1-x-y-z}N$ (where $0 \leq x < 1$, $0 < y < 1$, $0 \leq z < 1$, and $0 \leq x+y+z < 1$). For example, as shown in FIG. 7A, the buffer layer 20 may include a first layer 21 and a second layer 22. The first layer 21 may be used as a seed layer of providing nucleation sites for crystal growth and may be used to mitigate or prevent the growth substrate 10 and a gallium nitride (GaN) layer thereon from contacting each other and from reacting with each other, thereby consequently to mitigating or preventing a melt-back phenomenon. The melt-back phenomenon may lead to deterioration in crystalline characteristics of a semiconductor device. The first layer 21 may be configured to improve a wetting property between the first layer 21 and the second layer 22 to be formed on the first layer 21. As an example, the first layer 21 may be an AlN layer. The second layer 22 may be a nitride semiconductor layer whose lattice constant is larger than that of the first layer 21. As an example, the second layer 22 may be an AlGaN layer. In the second layer 22, a composition ratio of each of aluminum and gallium may be invariant or may be continuously changed in a thickness direction.

As shown in FIG. 7B, the buffer layer 20 may include a plurality of first layers 21 and a plurality of second layers 22, which are alternately stacked one on top of each other. As an example, each of the first layers 21 may have a thickness of 5-100 nm, and each of the second layers 22 may have a thickness of 50-500 nm. A thickness of each of the first and second layers 21 and 22 and/or a total thickness of the buffer layer 20 may be controlled to adjust stress in the buffer layer 20. In the case where the buffer layer 20 has the multi-layered structure, compressive stress may be produced in the buffer layer 20, due to a difference in lattice constant between each adjacent pair of the first and second layers 21 and 22. Further, the repeatedly stacked structure of the first and second layers 21 and 22 may exert tensile stress on the growth substrate 10 thereunder. In certain example embodiments, the compressive or tensile stress may be produced not only by the difference in lattice constants between the first and second layers 21 and 22 but also by a difference in thermal expansion coefficients between the growth substrate 10 and the buffer layer 20, and/or a difference in thermal expansion coefficients between the first and second layers 21 and 22.

The stress caused by the buffer layer 20 may lead to plastic deformation of the growth substrate 10. For example, a plurality of slips SL may be formed on a top surface of the growth substrate 10 in contact with the buffer layer 20, as shown in FIG. 9. In certain example embodiments, the stress caused by the buffer layer 20 may not cause plastic deformation of the growth substrate 10.

Figure 3:
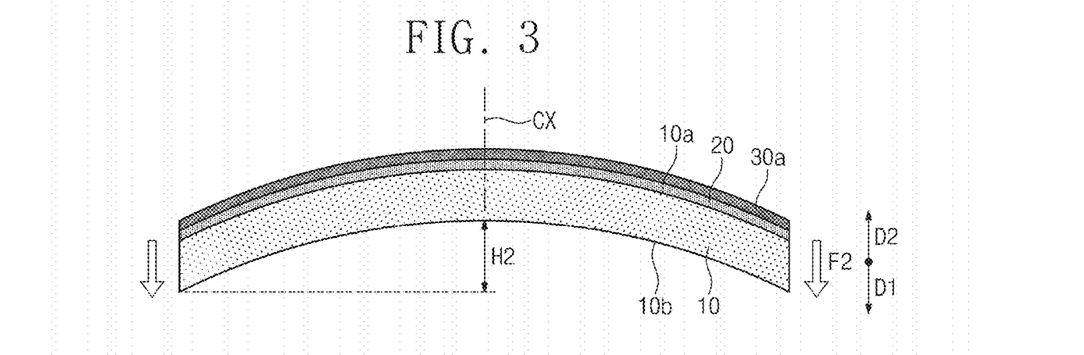

Referring to FIGS. 1 and 3, within the first process chamber, a first nitride semiconductor layer 30a may be formed on the buffer layer 20 (S2). The first nitride semiconductor layer 30a may be grown within the same chamber as that for the buffer layer 20 and in the same manner as that for the buffer layer 20. A thickness of the first nitride semiconductor layer 30a may be about 80% to 200% of that of the buffer layer 20. As an example, the first nitride semiconductor layer 30a may be a GaN layer. The first nitride semiconductor layer 30a may have tensile stress due to a difference in defect densities between upper and lower portions thereof and inclination of threading dislocation. As a result, the first deformation force F1 may be reduced, and hereinafter, the first deformation force with the reduced magnitude will be referred to as a second deformation force F2. The second deformation force F2 may be about 80% to 95% of the first deformation force F1. A height difference H2 between the edge and center portions of the growth substrate 10 may become smaller than the height difference H1 before the formation of the first nitride semiconductor layer 30a.

Furthermore, a surface treatment process, which facilitates subsequent three-dimensional growth of nitride semiconductor layers and reduction of crystal defects, may be performed on the first nitride semiconductor layer 30a. Referring to FIG. 8, a silane treatment process may be performed on the first nitride semiconductor layer 30a to form a silicon nitride masking layer 35. The silicon nitride masking layer 35 may be a thin (e.g., of several angstroms) masking layer, which is formed to locally expose the top surface of the first nitride semiconductor layer 30a and is used to guide a subsequent vertical growth of the nitride semiconductor patterns 30c. In certain example embodiments, the silicon nitride masking layer 35 may be formed to randomly or irregularly cover the top surface of the first nitride semiconductor layer 30a. The silane treatment process may be performed within the first process chamber, which is used to form the buffer layer 20 and the first nitride semiconductor layer 30a. The silane treatment process may include supplying process gas (e.g., $SiH_4$ and $NH_3$), along with carrier gas (e.g., $N_2$ or $H_2$), into the first process chamber at a high temperature. As an example, the silane treatment process may be performed at a temperature of about 500-1200° C. During the silane treatment process, threading dislocations exposed through the surface of the first nitride semiconductor layer 30a may be firstly etched. Thus, additional formation of threading dislocations may be suppressed.

After the silane treatment process, an additional nitride semiconductor layer may be formed within the first process chamber. Thereafter, a wet etching process may be performed on the additional nitride semiconductor layer. Accordingly, nitride semiconductor patterns 30c may be formed, as shown in FIG. 8. During the wet etching process, threading dislocations exposed through a surface of the additional nitride semiconductor layer may be firstly etched. Thus, additional formation of threading dislocations may be suppressed. In a subsequent step of three-dimensionally growing a nitride semiconductor layer within a second process chamber, the nitride semiconductor patterns 30c may be used to guide the three-dimensional growth of the nitride semiconductor layer. The wet etching process may be performed using, for example, a mixture of sulfuric acid and hydrogen peroxide ($H_2SO_4+H_2O_2$), phosphoric acid ($H_3PO_4$), and/or potassium hydroxide (KOH). The wet etching process may be performed after unloading the substrate or a wafer from the first process chamber. In certain example embodiments, one of the silane treatment process and the wet etching process may be performed. For the sake of simplicity, the description that follows will refer to examples in which the surface treatment process is omitted.

Figure 4:
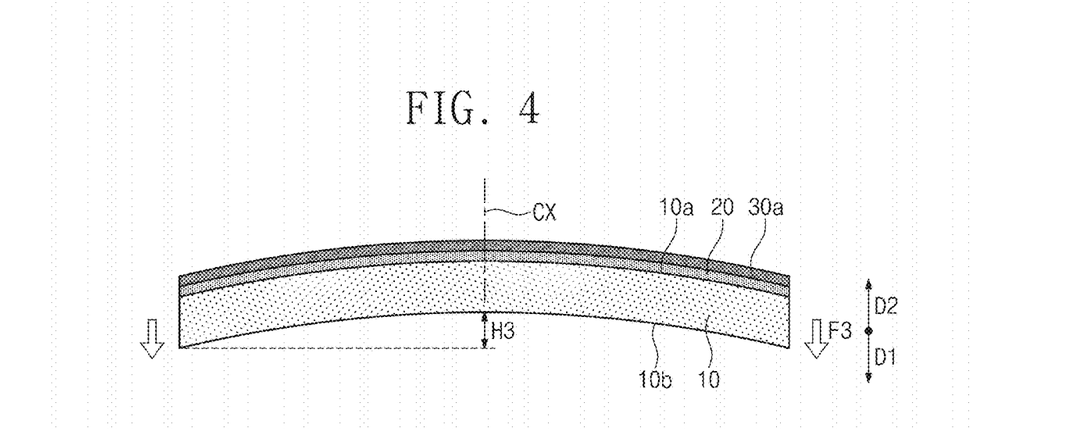

Referring to FIGS. 1 and 4, after forming the first nitride semiconductor layer 30a, the growth substrate 10 may be unloaded from the first process chamber and a cooling process may be performed on the growth substrate 10 (S3). For example, the growth substrate 10 may be cooled to room temperature. In other words, cooling the growth substrate 10 with the first nitride semiconductor layer 30a thereon may include cooling the growth substrate to room temperature. As the cooling process progresses, the stress, which is caused by a difference in thermal expansion coefficients between the growth substrate 10 and the buffer layer 20 and/or between the first and second layers 21 and 22 of the buffer layer 20, may be gradually reduced. As a result, a third deformation force F3, which is weaker than the second deformation force F2, may be exerted on the edge portion in the first direction D1. The first surface 10a of the growth substrate 10 may have a non-flat shape, even after the first cooling process. The edge and center portions of the growth substrate 10 may be maintained to have a height difference H3 that is smaller than the height difference H2 of FIG. 3. As an example, the height difference H3 may be about 10% to 50% of the height difference H2.

Figure 5:
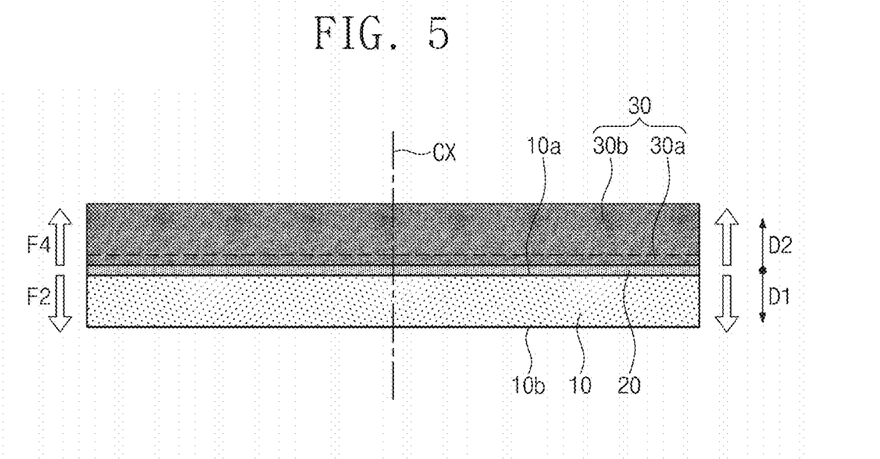

Referring to FIGS. 1 and 5, within a second process chamber, a second nitride semiconductor layer 30b may be grown on the first nitride semiconductor layer 30a (in S4). Hereinafter, the stack of the first and second nitride semiconductor layers 30a and 30b will be referred to as a nitride semiconductor substrate 30. A thickness of the second nitride semiconductor layer 30b may be about four to ten times that of the first nitride semiconductor layer 30a. In some example embodiments, the second nitride semiconductor layer 30b may be grown to have a thickness of about 100 µm to 2000 µm. The second nitride semiconductor layer 30b may be grown by a hybrid vapor phase epitaxy (HVPE) method. The second nitride semiconductor layer 30b may be formed of the same material as the first nitride semiconductor layer 30a. As an example, the second nitride semiconductor layer 30b may be a GaN layer. Hereinafter, a process of forming the second nitride semiconductor layer 30b will be described in more detail below.

Figure 10:
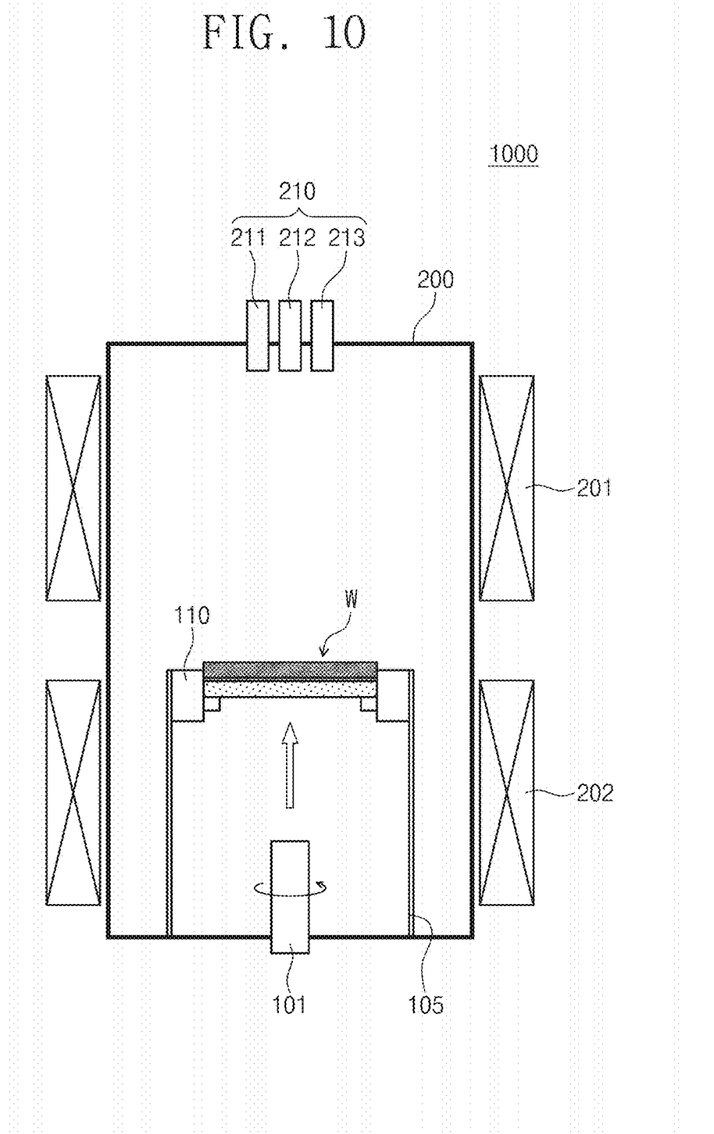
FIG. 10 is a schematic diagram illustrating an HVPE system according to some example embodiments of the inventive concepts.

FIG. 10 is a schematic diagram illustrating an HVPE system 1000 according to some example embodiments of the inventive concepts. The system 1000 may include a process chamber 200, sources 210, which are connected to an upper portion of the process chamber 200, and heaters 201 and 202, which are coupled to a side wall of the process chamber 200. The heaters 201 and 202 may include a first heater 201 and a second heater 202, which are respectively coupled to upper and lower portions of the process chamber 200 and are independently controlled. The sources 210 may include first to third sources 211, 212, and 213, at least one of which is used as a source of a carrier gas, and at least another of which is used as a source for forming a layer. In some example embodiments, the first source 211, the second source 212, and the third source 213 may be configured to supply $N_2$, $NH_3$, and GaCl gases, respectively. The third source 213 may be configured to supply GaCl gas, which is produced through reaction of HCl with Ga, into the process chamber 200.

A wafer W, a target object of a process, may be loaded on a susceptor 110, which is provided in the process chamber 200, and may be heated by the heaters 201 and 202. The susceptor 110 may be supported by a susceptor supporter 105. In some example embodiments, the process chamber 200 may be heated to a temperature of about 950 to about 1200° C. As a result of the heating, the wafer W may be re-deformed from the shape of FIG. 4 to the shape of FIG. 3.

Referring to FIG. 5, as the growth of the second nitride semiconductor layer 30b progresses, the wafer including the growth substrate 10, the buffer layer 20, and the nitride semiconductor substrate 30 may be deformed to have a substantially flat shape. For example, as the growth of the second nitride semiconductor layer 30b progresses, the tensile stress in the second nitride semiconductor layer 30b may have a non-vanishing gradient, due to the difference in defect densities between upper and lower portions of the second nitride semiconductor layer 30b and/or the inclination of threading dislocations. Owing to the non-vanishing gradient of the tensile stress, a fourth deformation force F4, which acts in a direction opposite to the second deformation force F2 or in the second direction D2, may be produced in the wafer. The fourth deformation force F4 may be proportional to the thickness of the second nitride semiconductor layer 30b. Meanwhile, if there is no second deformation force F2, the fourth deformation force F4 may lead to deformation of the edge portion of the wafer in the second direction D2 such that the wafer may have a concave shape or may have a curvature, whose sign is opposite to that of the convex shape. Such a concave shape may lead to a difficulty in a subsequent process (e.g., a polishing process) on a wafer and may increase the number of cracks in the nitride semiconductor layer. That is, the concave shape may cause low productivity of the subsequent process. In contrast, when the nitride semiconductor substrate 30 is formed to have a desired thickness, the fourth deformation force F4 may be exerted on the wafer, while the second deformation force F2 caused by the buffer layer 20 has been exerted on the wafer. Thus, the second and fourth deformation forces F2 and F4 may have the same (or substantially similar) magnitude and opposite directions. Thus, the wafer with the nitride semiconductor substrate 30 may have a substantially flat shape.

Figure 6:
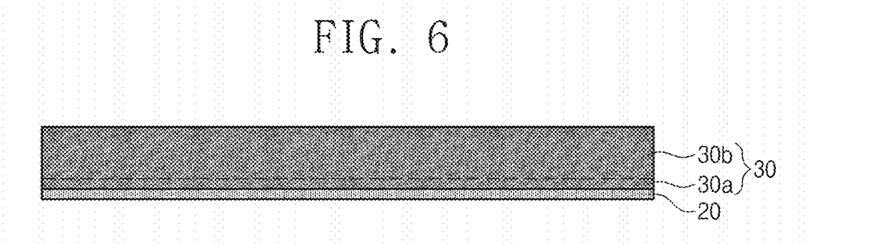

Referring to FIGS. 1 and 6, after completing the growth of the second nitride semiconductor layer 30b, the growth substrate 10 may be removed from the wafer (S5). The removal of the growth substrate 10 may be performed in-situ within the second process chamber (e.g., the process chamber 200).

The HVPE system 1000 of FIG. 10 may include an etching nozzle 101, which is provided below the susceptor 110 and is used to chemically remove the growth substrate 10. For example, the etching nozzle 101 may be configured to supply etching gas onto a bottom surface of the wafer. In some example embodiments, the etching gas may contain HCl gas and may be transferred to the bottom surface of the wafer by a carrier gas. The etching nozzle 101 may be configured to rotate about its longitudinal axis, during the supply of the etching gas.

In the case where the removal of the growth substrate 10 is performed (i) within the process chamber 200 or (ii) after the cooling process, a difference in thermal expansion coefficients may occurs and lead to additional deformation, which causes deterioration in final flatness of the nitride semiconductor substrate 30. According to some example embodiments of the inventive concepts, the removal of the growth substrate 10 may be performed in an in-situ etching manner at about 700 to 1300° C. For example, the removal of the growth substrate 10 may be performed at high temperature so that the growth substrate 10 may be removed without deformation of the nitride semiconductor substrate 30. Thus, additional deformation occurring in the removal process, which is performed after the cooling process, may be mitigated or prevented.

The removal of the growth substrate 10 may be performed during or after growing the second nitride semiconductor layer 30b. In the case where the removal of the growth substrate 10 is performed after growing the second nitride semiconductor layer 30b, the removal of the growth substrate 10 may be performed at a process temperature that is different from the growth temperature (or a process temperature) of the second nitride semiconductor layer 30b, by about 250° C. or less. In other words, a difference in process temperatures between growing the second nitride semiconductor layer 30b and removing the growth substrate 10 may be less than 250° C. In certain example embodiments, the removal of the growth substrate 10 may be performed after forming a portion of the nitride semiconductor layer 30, and the remaining portion of the second nitride semiconductor layer 30b may be formed after the removal of the growth substrate 10.

The removal of the growth substrate 10 may be performed to expose at least a portion of the buffer layer 20. Thereafter, the wafer, from which the growth substrate 10 is removed, may be unloaded from the process chamber 200, and a second cooling process may be performed on the unloaded wafer (S6). The process of forming the nitride semiconductor substrate 30 may include polishing and post-treatment processes, which are performed on the unloaded wafer to completely remove the buffer layer 20.

The nitride semiconductor substrate 30 may be used as a base substrate for light emitting diode (LED), laser diode (LD), field effect transistor (FET), high electron mobility transistor (HEMT), Schottky diode, and so forth. For example, an additional process may be further performed to form a semiconductor device on the nitride semiconductor substrate 30.

According to some example embodiments of the inventive concepts, it may be possible to suppress warpage of a substrate, which is caused by a difference in lattice constants and/or thermal expansion coefficients between layers constituting the substrate when a growth process for forming a nitride semiconductor substrate is performed. For example, a buffer layer may be provided to compensate stress, which occurs when a gallium nitride layer is grown, and thus, a nitride semiconductor substrate can be formed to have a flat surface.

While some example embodiments of the inventive concepts have been particularly shown and described, it will be understood by one of ordinary skill in the art that variations in form and detail may be made therein without departing from the spirit and scope of the attached claims.

What is claimed is:

1. A method of fabricating a nitride semiconductor substrate, comprising:
   forming a buffer layer on a surface of a growth substrate within a first process chamber, the forming a buffer layer deforming the surface of the growth substrate to have a convex shape;

growing a first nitride semiconductor layer on the buffer layer within the first process chamber;

growing a second nitride semiconductor layer on the first nitride semiconductor layer, the growing a second nitride semiconductor layer performed within a second process chamber;

removing the growth substrate within the second process chamber; and cooling the growth substrate with the first nitride semiconductor layer to room temperature after the growing a first nitride semiconductor layer and before the growing a second nitride semiconductor layer.

2. The method of claim 1, wherein the convex shape of the growth substrate is maintained after the cooling the growth substrate.

3. The method of claim 1, wherein the growth substrate is a silicon substrate.

4. The method of claim 1, wherein the forming a buffer layer comprises alternately stacking AlN and AlGaN layers one or more times.

5. The method of claim 1, wherein
the forming a buffer layer forms the buffer layer to have compressive stress, and
the growing a first nitride semiconductor layer and the growing a second nitride semiconductor layers form the first nitride semiconductor layer and the second nitride semiconductor layer to have tensile stress therein.

6. The method of claim 1, wherein
the second process chamber is configured to perform a Hybrid Vapor Phase Epitaxy (HVPE) process, and
the first process chamber is configured to perform one of Metal Organic Chemical Vapor Deposition (MOCVD), Molecular Beam Epitaxy (MBE), or Metal Organic Vapor Phase Epitaxy (MOVPE) processes.

7. The method of claim 1, wherein the removing the growth substrate is performed during or after the growing a second nitride semiconductor layer.

8. The method of claim 7, wherein
the removing the growth substrate is performed using etching gas containing HCl, and
the etching gas is supplied through an etching nozzle below a susceptor of the second process chamber.

9. The method of claim 1, further comprising:
performing a silane treatment process on the first nitride semiconductor layer within the first process chamber, after the forming a first nitride semiconductor layer.

10. The method of claim 1, wherein the removing the growth substrate is performed at a temperature of about 700 to 1300° C.

11. The method of claim 1, wherein the second nitride semiconductor layer is formed to have a thickness that is four to ten times that of the first nitride semiconductor layer.

12. A method of fabricating a semiconductor device, the method comprising:
forming a buffer layer on a growth substrate;
forming a first nitride semiconductor layer on the buffer layer;
forming a second nitride semiconductor layer on the first nitride semiconductor layer; and
removing the growth substrate,
wherein the forming a buffer layer and the forming a first nitride semiconductor layer are performed within a first process chamber,
the forming a second nitride semiconductor layer and the removing the growth substrate are performed within a second process chamber,
the buffer layer is formed to exert a first deformation force on an edge portion of the growth substrate in a first direction parallel to a center axis of the growth substrate,
the first and second nitride semiconductor layers are formed to exert a second deformation force on the edge portion of the growth substrate in a second direction opposite to the first direction, and
the first and second deformation forces have substantially a same magnitude.

13. The method of claim 12, wherein the forming a buffer layer comprises alternately stacking AlN and AlGaN layers one or more times.

14. The method of claim 12, wherein a difference in process temperatures between the forming a second nitride semiconductor layer and the removing the growth substrate is less than 250° C.

15. A method of fabricating a nitride semiconductor substrate, comprising:
forming a buffer layer on a surface of a growth substrate in a first process chamber, the forming a buffer layer deforming the surface of the growth substrate to have a convex shape;
growing a first nitride semiconductor layer on the buffer layer in the first process chamber, the first nitride semiconductor layer having a lattice constant greater than that of the growth substrate;
growing a second nitride semiconductor layer on the first nitride semiconductor layer in a second process chamber, the second nitride semiconductor layer having a lattice constant greater than that of the growth substrate; and
removing the growth substrate within the second process chamber.

16. The method of claim 15, wherein the forming a buffer layer comprises alternately stacking AlN and AlGaN layers one or more times.

17. The method of claim 15, further comprising:
forming a silicon nitride masking layer of several angstroms on the first nitride semiconductor layer within the first process chamber.

18. The method of claim 17, further comprising:
three-dimensionally growing nitride semiconductor patterns on the silicon nitride masking layer, which irregularly covering a top surface of the first nitride semiconductor layer, within the first process chamber such that the nitride semiconductor patterns expose a surface of the first nitride semiconductor layer therethrough.

19. The method of claim 15, further comprising:
cooling the growth substrate with the first nitride semiconductor layer to room temperature after the growing a first nitride semiconductor layer and before the growing a second nitride semiconductor layer.

* * * * *